(12) United States Patent
Katsuda

(10) Patent No.: US 8,598,556 B2
(45) Date of Patent: Dec. 3, 2013

(54) SUBSTRATE POSITIONING DEVICE

(71) Applicant: Kabushiki Kaisha Yaskawa Denki, Fukuoka (JP)

(72) Inventor: Shinichi Katsuda, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 13/670,588

(22) Filed: Nov. 7, 2012

(65) Prior Publication Data
US 2013/0194574 A1    Aug. 1, 2013

(30) Foreign Application Priority Data
Jan. 26, 2012  (JP) ................ 2012-014089

(51) Int. Cl.
*G01N 21/86* (2006.01)
(52) U.S. Cl.
USPC .............. 250/559.29; 250/549; 250/559.36
(58) Field of Classification Search
USPC ........................... 250/548, 559.36
See application file for complete search history.

(56) References Cited

U.S. PATENT DOCUMENTS

2004/0056216 A1\* 3/2004 Inenaga et al. ............ 250/548
2004/0136000 A1   7/2004 Kurokawa

FOREIGN PATENT DOCUMENTS

JP   2004-200643   7/2004

\* cited by examiner

*Primary Examiner* — Gregory J Toatley
*Assistant Examiner* — Iyabo S Alli
(74) *Attorney, Agent, or Firm* — Bacon & Thomas, PLLC

(57) ABSTRACT

A substrate positioning device includes: a supporting unit for supporting a substrate in place; a light emitting unit and a light receiving unit respectively arranged at major surface sides of the substrate to face each other; a light emission control unit configured to control a light emission quantity of the light emitting unit pursuant to a control value; and a detecting unit for detecting a light reception quantity received by the light receiving unit. The substrate positioning device further includes an adjusting unit for controlling the control value pursuant to the light reception quantity while the substrate is not supported by the supporting unit.

17 Claims, 12 Drawing Sheets

| LOWER LIMIT WARNING VALUE | a |
|---|---|
| LOWER LIMIT VALUE | b |
| ⋮ | ⋮ |

| UPPER LIMIT VALUE | c |
|---|---|
| UPPER LIMIT WARNING VALUE | d |
| REFERENCE VALUE | e |
| CORRECTION VALUE | 0 |
| PRESENT VALUE | v |
| ⋮ | ⋮ |

82a

|  | DIAMETER | PERMISSIBLE WIDTH | ... |
|---|---|---|---|
| SUBSTRATE A | g | ±i | ... |
| SUBSTRATE B | h | ±j | ... |
| ⋮ | ⋮ | ⋮ | ⋮ |

62c

|  | THRESHOLD VALUE | ... |
|---|---|---|
| SUBSTRATE A | k | ... |
| SUBSTRATE B | l | ... |
| ⋮ | ⋮ | ⋮ |

SUBSTRATE POSITIONING DEVICE

CROSS-REFERENCE TO RELATED APPLICATIONS

The present application claims priority under 35 U.S.C. §119 to Japanese Patent Application No. 2012-014089 filed on Jan. 26, 2012. The contents of this application are incorporated herein by reference in their entirety.

BACKGROUND OF THE INVENTION

1. Field of the Invention

An embodiment disclosed herein relates to a substrate positioning device.

2. Description of the Related Art

Japanese Patent Application Publication No. 2004-200643 discloses an alignment device (hereinafter referred to as "substrate positioning device") that performs the positioning of a substrate such as a wafer or the like when the substrate is transferred by a robot in a space defined within a local clean device called an EFEM (Equipment Front End Module).

This substrate positioning device performs the positioning of a substrate based on, e.g., the light quantity change which is detected when the outer peripheral portion of the substrate interrupts an optical axis created by a light emitting element and a light receiving element arranged to interpose the outer peripheral portion of the substrate therebetween from major surface sides.

SUMMARY OF THE INVENTION

In accordance with embodiment, there is provided a substrate positioning device including: a supporting unit for supporting a substrate in place; a light emitting unit and a light receiving unit respectively arranged at major surface sides of the substrate to face each other; a light emission control unit is configured to control a light emission quantity of the light emitting unit pursuant to a control value; a detecting unit for detecting a light reception quantity received by the light receiving unit; and an adjusting unit for controlling the control value pursuant to the light reception quantity while the substrate is not supported by the supporting unit.

BRIEF DESCRIPTION OF THE DRAWINGS

The objects and features of the present invention will become apparent from the following description of embodiments, given in conjunction with the accompanying drawings, in which:

FIG. 4A is a view illustrating one example of the light reception quantity information;

FIG. 4B is a view illustrating one example of the control value information;

DESCRIPTION OF THE EMBODIMENTS

Embodiments of a substrate positioning device disclosed herein will now be described in detail with reference to the accompanying drawings which form a part hereof. However, the present disclosure is not limited to the embodiment to be described below.

In the following description, a substrate transferring processing system for transferring a semiconductor wafer through the use of a robot and for performing specific processing will be described by way of example. The semiconductor wafer will be just referred to as a "wafer". The end effector of the robot will be referred to as a "hand".

First, the overall configuration of a substrate transferring processing system provided with a substrate positioning device in accordance with an embodiment will be described with reference to FIG. 1.

Figure 1:
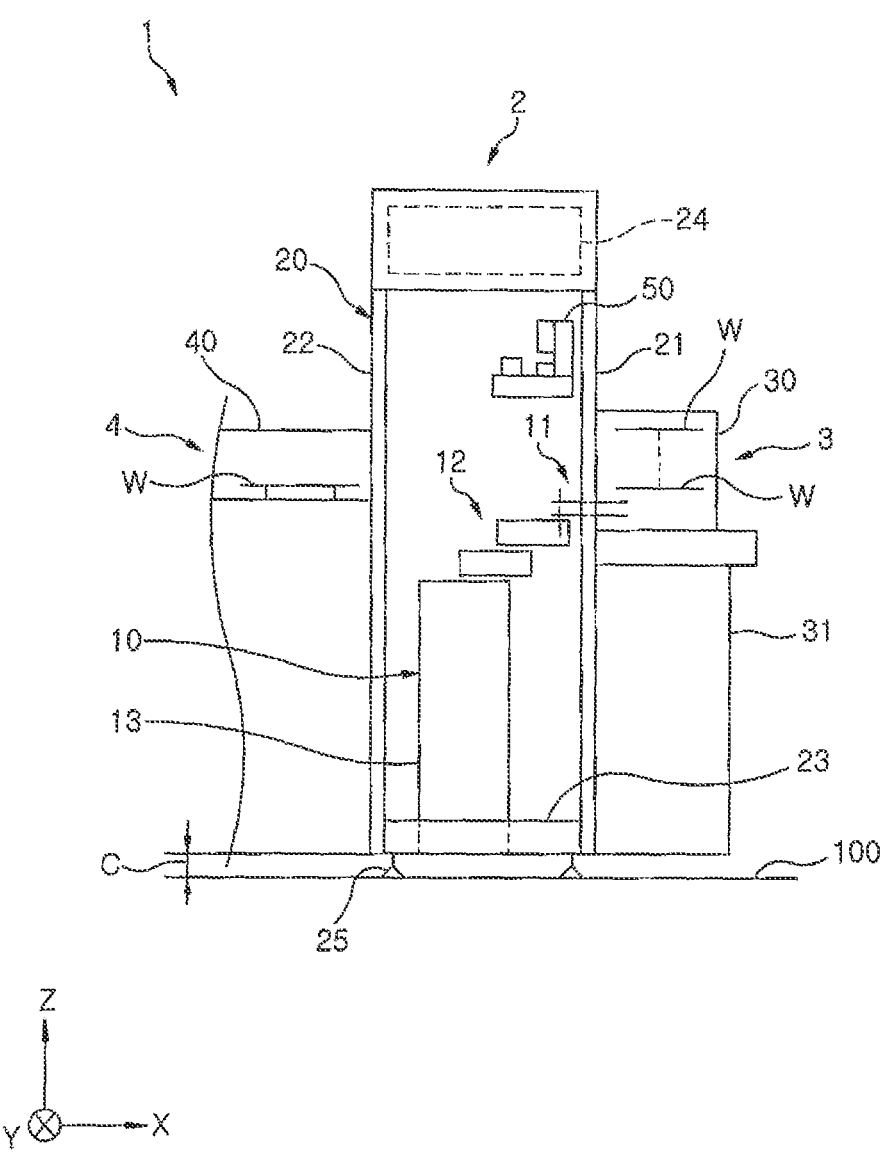
FIG. 1 is a schematic diagram showing the overall configuration of a substrate transferring processing system provided with a substrate positioning device in accordance with an embodiment.

For the sake of easier understanding of the description, FIG. 1 indicates a three-dimensional rectangular coordinate system including a Z-axis whose vertical upper side is the positive side and whose vertical lower side is the negative side. The direction extending along an XY plane denotes a horizontal direction. It is sometimes the case that the rectangular coordinate system is indicated in other figures used in the following description.

In the following description, it is sometimes the case that only one of a plurality of components is designated by a reference symbol while the remaining components are not given reference symbols. In that case, one component designated by a reference symbol has the same configuration as the remaining components.

As shown in FIG. 1, the substrate transferring processing system 1 includes a substrate transfer unit 2, a substrate supply unit 3 and a substrate processing unit 4. The substrate transfer unit 2 includes a robot 10 and a housing 20 within which the robot 10 is arranged. The substrate supply unit 3 is arranged on one side surface 21 of the housing 20. The substrate processing unit 4 is arranged on the other side surface 22 of the housing 20. Reference symbol 100 in FIG. 1 designates an installation surface of the substrate transferring processing system 1.

The robot 10 includes an arm unit 12 having a hand 11 capable of holding a wafer W an object to be transferred with two upper and lower stages. The arm unit 12 is supported to vertically move and horizontally swing with respect to a base 13 installed on a base installation frame 23 forming the bottom wall of the housing 20.

The housing 20 is a so-called EFEM (Equipment Front End Module) and is configured to form a down-flow of clean air through the use of a filter unit 24 arranged above the housing 20. By the down-flow thus formed, the inside of the housing 20 is kept at a high degree of cleanliness. Legs 25 are provided on the bottom surface of the base installation frame 23 to support the housing 20 with a specified clearance C interposed between the housing 20 and the installation surface 100.

The substrate supply unit 3 includes a hoop 30 for storing a plurality of wafers W at multiple stages in the height direction and a hoop opener (not shown) for opening and closing a lid of the hoop 30 so that the wafers W can be taken out into the housing 20. Plural sets of the hoop 30 and the hoop opener may be installed at a predetermined interval on a table 31 having a specific height.

The substrate processing unit 4 is a processing unit for subjecting the wafers W to specified processing in a semiconductor manufacturing process, such as cleaning, film forming or photolithography. The substrate processing unit includes a processing device 40 for performing the specified processing stated above. The processing device 40 is arranged on the other surface 22 of the housing 20 so as to oppose the substrate supply unit 3 across the robot 10.

A substrate positioning device 50 for performing the positioning of wafer W is provided within the housing 20. Details of the substrate positioning device 50 will be described later with reference to FIGS. 2A and 2B.

With the configuration described above, the substrate transferring processing system 1 causes the robot 10 to take out the wafers W from the hoop 30 while making an up-and-down motion and a swing motion. The robot 10 loads the wafers W into the processing device 40 through the substrate positioning device 50. After the wafers W are subjected to a specific process in the processing device 40, the robot 10 unloads and transfers the wafers W to store the wafers W into the hoop 30 again.

Next, the configuration of the substrate positioning device 50 in accordance with the embodiment will be described with reference to FIG. 2A.

Figure 2A:
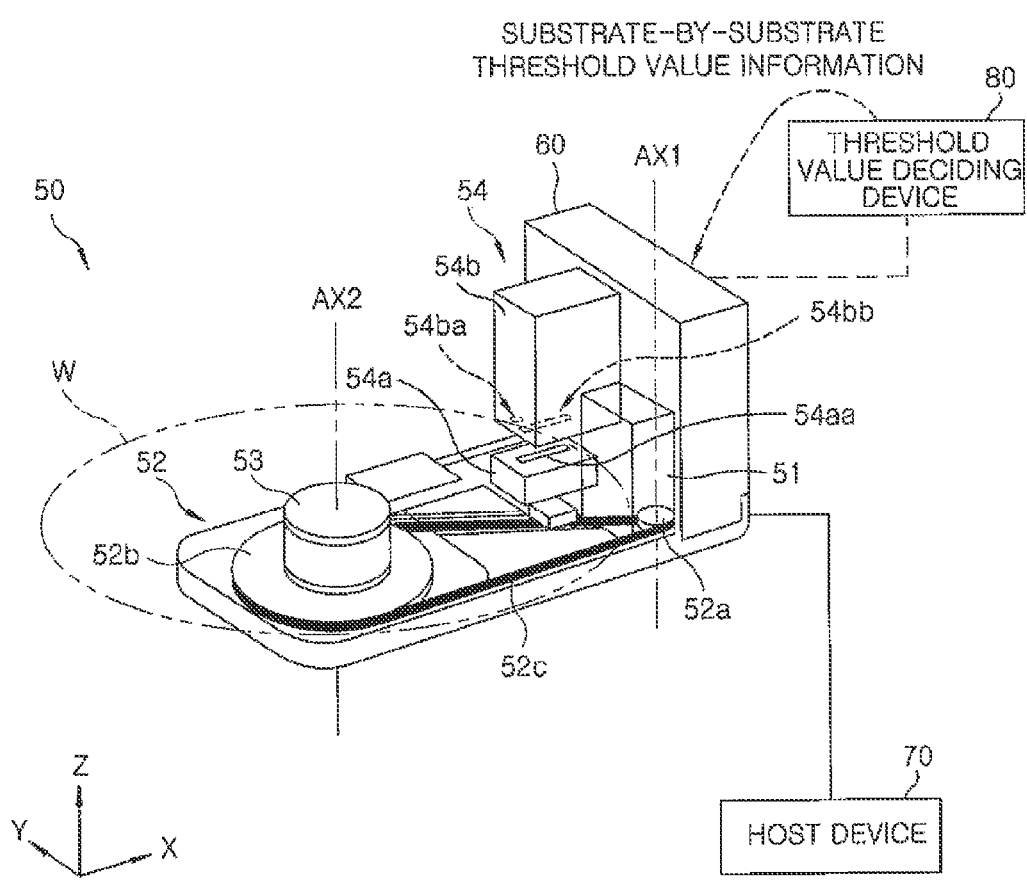
FIG. 2A is a schematic perspective view showing the configuration of the substrate positioning device in accordance with the embodiment.

As shown in FIG. 2A, the substrate positioning device 50 includes a motor 51, a power transmission mechanism 52, a mounting table (supporting unit) 53, a sensor unit 54 and a control device 60. The power transmission mechanism 52 includes a driving pulley 52a, a driven pulley 52b and a belt 52c.

The sensor unit 54 includes a light emitting unit 54a and a light receiving unit 54b. The light emitting unit 54a includes a light source 54aa. The light receiving unit 54b includes a photodiode 54ba and a line sensor 54bb.

The motor 51 is a driving source for rotating an axis AX1. The driving pulley 52a of the power transmission mechanism 52 is arranged in the output shaft (i.e., the driving shaft corresponding to the axis AX1) of the motor 51 and is rotated together with the rotation of the motor 51. The rotation angle of the motor 51 (i.e., the rotation angle of the driving pulley 52a) is periodically detected by an encoder or the like not shown in the drawings.

The driven pulley 52b is rotatably provided on a rotated shaft around an axis AX2 (i.e., a driven shaft corresponding to the axis AX2).

While not shown in the drawings, the driving pulley 52a and the driven pulley 52b have external teeth substantially equal in pitch width to each other. The belt 52c as a toothed belt having a pitch width substantially equal to the pitch width of the external teeth is engaged between the driving pulley 52a and the driven pulley 52b to be wound therearound. Consequently, the rotation of the driving pulley 52a is transmitted to the driven pulley 52b through the belt 52c, whereby the driven pulley 52b is rotationally driven by the driving pulley 52a.

Instead of using the power transmission mechanism 52, the motor 51 and the driven pulley 52b may be directly coupled to each other.

The mounting table 53 for supporting and holding the wafer W is provided on the driven pulley 52b. As the driven pulley 52b is driven and rotated, the mounting table 53 rotates the wafer W for position alignment of the wafer W.

While not shown in the drawings, the mounting table 53 may be provided with an adsorption unit for adsorbing the wafer W. The adsorption unit holds the wafer W with a specific holding force (i.e., an adsorptive force), thereby preventing the wafer W from being displaced by a centrifugal force. This makes it possible to increase the accuracy of position alignment.

Figure 2B:
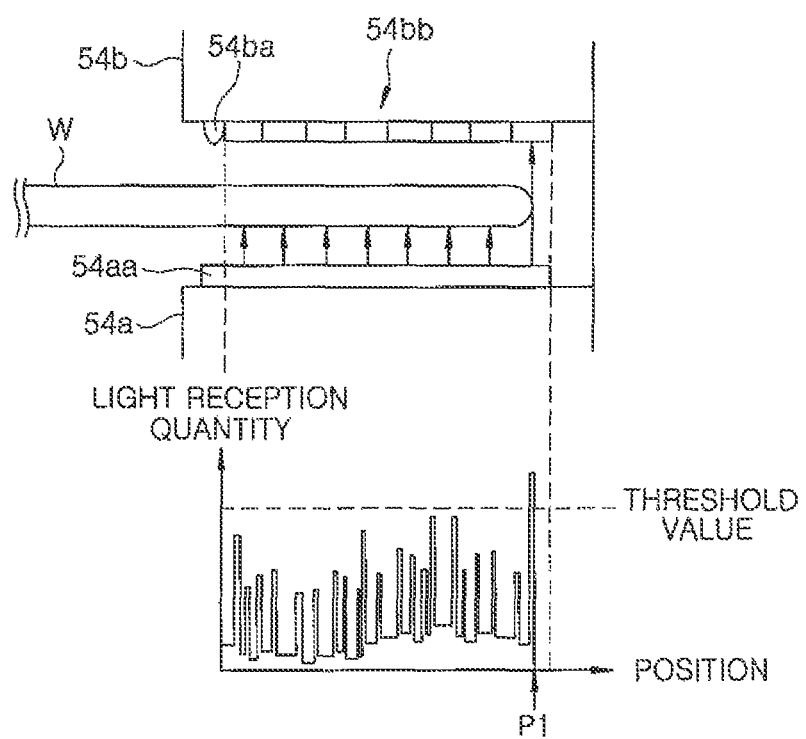
FIG. 2B shows a schematic side view of sensor unit and the light reception quantity detected by the sensor unit.

The sensor unit 54 is a device for optically detecting the outer peripheral portion of the wafer W. The sensor unit 54 will now be described with reference to FIG. 2B. FIG. 2B shows a schematic side view of the sensor unit 54 and the light reception quantity detected by the sensor unit 54.

As shown in FIG. 2B, the light emitting unit 54a and the light receiving unit 54b are arranged over the respective major of the wafer W placed on the mounting table 53 to face each other. In other words, the light receiving unit 54b is arranged to receive the light emitted from the light source 54aa (see the arrows upwardly proceeding from the light source 54aa in FIG. 2B) through the wafer W. While not shown in FIG. 2B, the light received by the light receiving unit 54b includes the light transmitted through the wafer W and the light scattered by the wafer W.

The light receiving unit 54b converts the received light to an electrical signal indicative of the light reception quantity and outputs the electrical signal to the control device 60 (see FIG. 2A). In the control device 60, as shown in FIG. 2B, the position P1 of the wafer W indicating the light reception quantity larger than a predetermined threshold value is acquired as the edge position of the wafer W.

Based on the edge position thus acquired, the control device 60 identifies a notch or an orientation flat formed in the outer peripheral portion of the wafer W. Pursuant to the orientation of the notch or the orientation flat thus identified, the control device 60 rotates the motor 51 to align the position of the wafer W.

When aligning the position of the wafer W in this manner, it is desirable that the light reception quantity in the photodiode 54ba is used to confirm the existence or absence of the wafer W while the light reception quantity in the line sensor 54bb is used to acquire the shape of the outer peripheral portion of the wafer W.

Referring back to FIG. 2A, description will be made on the control device 60. The control device 60 is a control unit for controlling the substrate positioning device 50. The location of the control device 60 is not limited to the one shown in FIG. 2A.

A host device 70 is connected to the control device 60 in a mutually communicating manner. The host device 70 notifies the control device 60 of the kind of the wafer W handled in the substrate positioning device 50.

As indicated by a dashed line in FIG. 2A, a threshold value deciding device 80 for deciding a threshold value required in acquiring the edge position of the wafer W is connected to the unshipped substrate positioning device 50.

The threshold value deciding device 80 will be described later with reference to FIGS. 7 through 9. The threshold value decided by the threshold value deciding device 80 is included in the substrate-by-substrate threshold value information to be described later and is stored in the control device 60 during shipment. A processing unit for performing a threshold value deciding sequence in the threshold value deciding device 80 may be built in the control device 60 so that the threshold value can be dynamically adjusted during the actual operation after shipment. In this regard, description will be made later with reference to FIGS. 7 through 9.

The light source 54$aa$ is controlled (namely, the light emission quantity is determined) by the control value outputted from a light emission control unit to be described later. It is however sometimes the case that, due to the over-time degradation, the light source 54$aa$ cannot output the light emission quantity indicated by the control value.

In light of this, the substrate positioning device 50 in accordance with the present embodiment is configured to adjust the control value pursuant to the light reception quantity while the wafer W is not held in place. Description will now be made on this point.

In the following description, it is assumed that the amount of a current supplied to the light source 54$aa$, i.e., the light emission quantity of the light source 54$aa$, grows larger as the control value gets increased.

Figure 3:
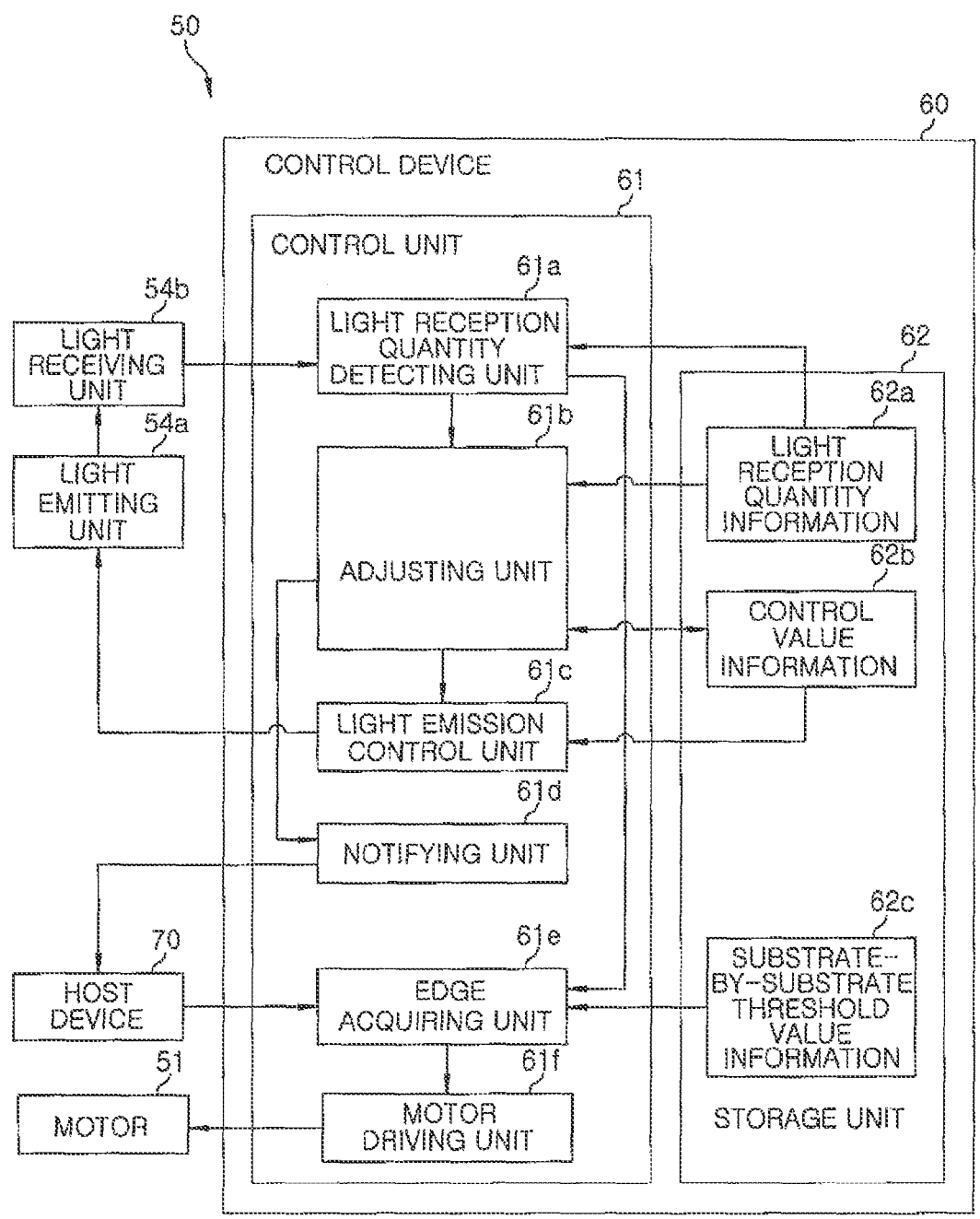
FIG. 3 is a block diagram illustrating one configuration example of the substrate positioning device in accordance with the embodiment.

FIG. 3 is a block diagram illustrating one configuration example of the substrate positioning device 50 in accordance with the embodiment. In FIG. 3, there are shown only the components required in describing an adjusting method of the substrate positioning device 50. Other typical components are not shown in FIG. 3.

While partially overlapping with the description made by referring to FIG. 2A, the substrate positioning device 50 shown in FIG. 3 includes a motor 51, a light emitting unit 54$a$, a light receiving unit 54$b$ and a control device 60. A host device 70 is connected to the control device 60. The remaining components of the substrate positioning device 50 shown in FIG. 2A will not be described here.

The control device 60 includes a control unit 61 and a storage unit 62. The control unit 61 includes a light reception quantity detecting unit 61$a$, an adjusting unit 61$b$, a light emission control unit 61$c$, a notifying unit 61$d$, an edge acquiring unit 61$e$ and a motor driving unit 61$f$. The storage unit 62 stores light reception quantity information 62$a$, control value information 62$b$ and substrate-by-substrate threshold value information 62$c$.

The motor 51, the light emitting unit 54$a$, the light receiving unit 54$b$ and the host device 70 have already been described above and, therefore, will be appropriately referred to in the following description.

The control unit 61 controls the overall operation of the control device 60. The light reception quantity detecting unit 61$a$ detects the light reception quantity in the light receiving unit 54$b$ as an electrical signal.

If the detected light reception quantity is smaller than a lower limit warning value included in the light reception quantity information 62$a$ of the storage unit 62 and if the wafer W is not held in place, the light reception quantity detecting unit 61$a$ regards it as an adjusting process startup trigger and delivers the detected light reception quantity to the adjusting unit 61$b$.

The light reception quantity delivered during the adjusting time is the light reception quantity of the photodiode 54$ba$ but may be the light reception quantity of the line sensor 54$bb$. During the normal time other than the adjusting time, the light reception quantity detecting unit 61$a$ delivers the detected light reception quantity to the edge acquiring unit 61$e$.

The adjusting unit 61$b$ adjusts the control value based on the present value as the current control value included in the control value information 62$b$ and the light reception quantity received from the light reception quantity detecting unit 61$a$. Details of the adjusting process will be described later with reference to FIGS. 4A to 5D.

During the adjusting process, the adjusting unit 61$b$ increases the control value and delivers the increased control value to the light emission control unit 61$c$. The adjusting unit 61$b$ renews the present value of the control value information 62$b$ with the increased control value. When the adjusting process is started, the present value may be reset by delivering the value equivalent to a lower limit (e.g., the reference value e) of the control value to the light emission control unit 61$c$.

The adjusting unit 61$b$ determines whether or not the light emitting unit 54$a$ is abnormal. When the light emitting unit 54$a$ is determined to be abnormal, the adjusting unit 61$b$ requests the notifying unit 61$d$ to notify such a situation.

The light emission control unit 61$c$ drives the light emitting unit 54$a$ pursuant to the control value received from the adjusting unit 61$b$. The notifying unit 61$d$ transmits a notice according the request from the adjusting unit 61$b$ to the host device 70, thereby notifying the abnormality of the light emitting unit 54$a$ to a user, e.g., an operator of the host device 70. The notifying unit 61$d$ may be formed of an output device such as a status lamp provided in the substrate positioning device 50.

Details of the adjusting process performed by the adjusting unit 61$b$ will now be described with reference to FIGS. 4A through 5D. First, the light reception quantity information 62$a$, the control value information 62$b$ and the relationship between control value and the light reception quantity will be described with reference to FIGS. 4A the 4C.

FIG. 4A is a view illustrating one example of the light reception quantity information 62$a$. As shown in FIG. 4A, the light reception quantity information 62$a$ is the information including a lower limit value and a lower limit warning value (a second threshold value). The lower limit value is a lower limit value of the light reception quantity that can be detected by the light reception quantity detecting unit 61$a$.

The lower limit warning value is larger than the lower limit value and indicates a light reception quantity of warning level. In the illustrated example, the lower limit warning value is set equal to "a" and the lower limit value is set equal to "b".

FIG. 4B is a view illustrating one example of the control value information 62$b$. As shown in FIG. 4B, the control value information 62$b$ is the information including an upper limit value and an upper limit warning value (a first threshold value). The upper limit value is an upper limit value of the control value that can be outputted by the light emission control unit 61$c$.

The upper limit warning value is smaller than the upper limit value and indicates a control value of warning level. In the illustrated example, the upper limit value is set equal to "c" and the upper limit warning value is set equal to "d".

As shown in FIG. 4B, the control value information 62$b$ further includes the reference value, a correction value and the present value of the control value. The reference value and the correction value will be described later with reference to FIG. 5A. In the illustrated example, the reference value is set equal to "e", the correction value is set equal to "0" and the present value is set equal to "v".

Figure 4C:
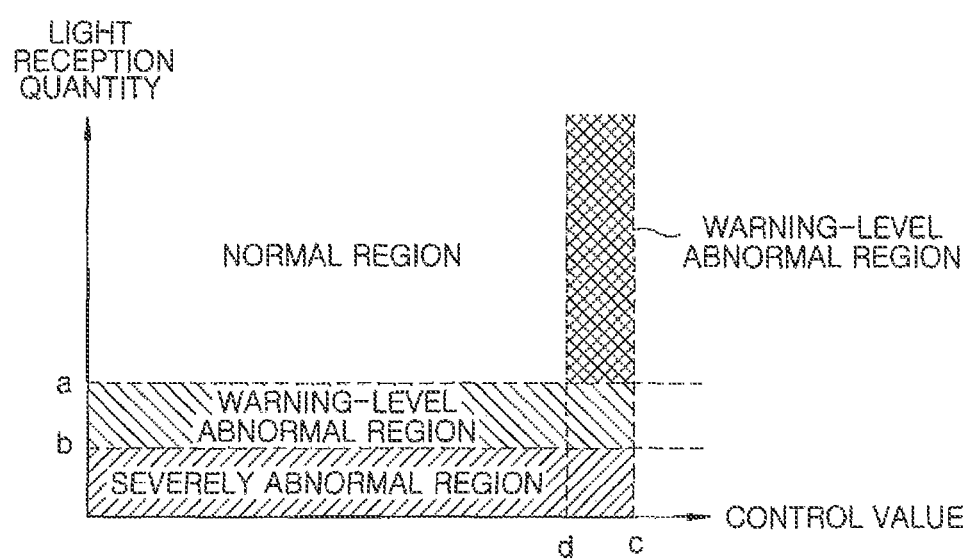
FIG. 4C is view representing the relationship between the control value and the light reception quantity.

Based on this premise, description will be made on the relationship between the control value and the light reception quantity. FIG. 4C is a view representing the relationship between the control value and the light reception quantity. This relationship is expressed in a coordinate system which has a horizontal axis indicating the control value and a vertical axis indicating the light reception quantity.

As shown in FIG. 4C, the coordinate system can be divided into a number of regions depending on the lower limit warning value a and the lower limit value b of the light reception quantity and the upper limit value c and the upper limit warning value d of the control value.

If the curve described by the control value and the actual light reception quantity reaches a "normal region" shown in FIG. 4C, the adjusting unit 61b determines that the light emitting unit 54a is normal.

If the curve reaches a "warning-level abnormal region" shown in FIG. 4C, the adjusting unit 61b determines that the light emitting unit 54a is abnormal at a warning level.

If the curve reaches a "severely abnormal region" shown in FIG. 4C, the adjusting unit 61b determines that the light emitting unit 54a is severely abnormal.

Figure 5A:
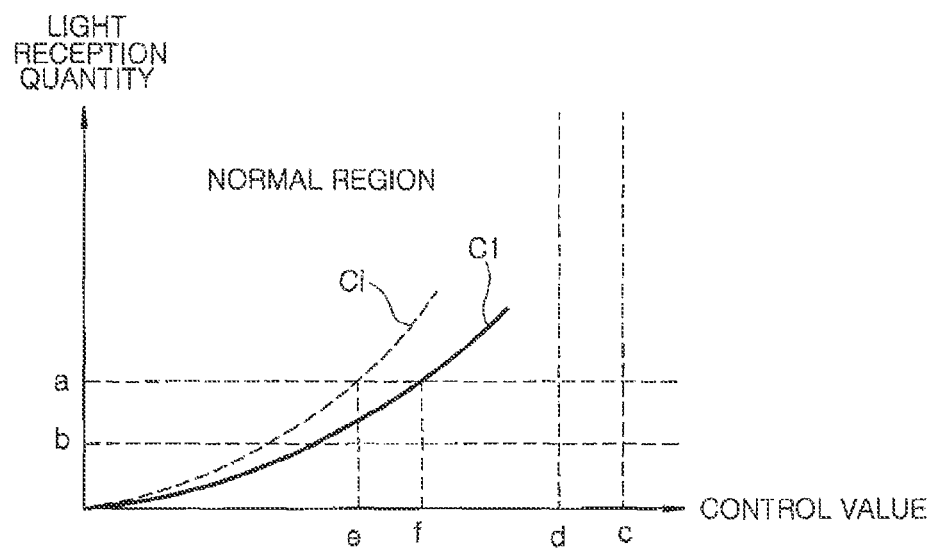
FIG. 5A is a view representing one example in which a light emitting unit is determined to be normal.
Figure 5B:
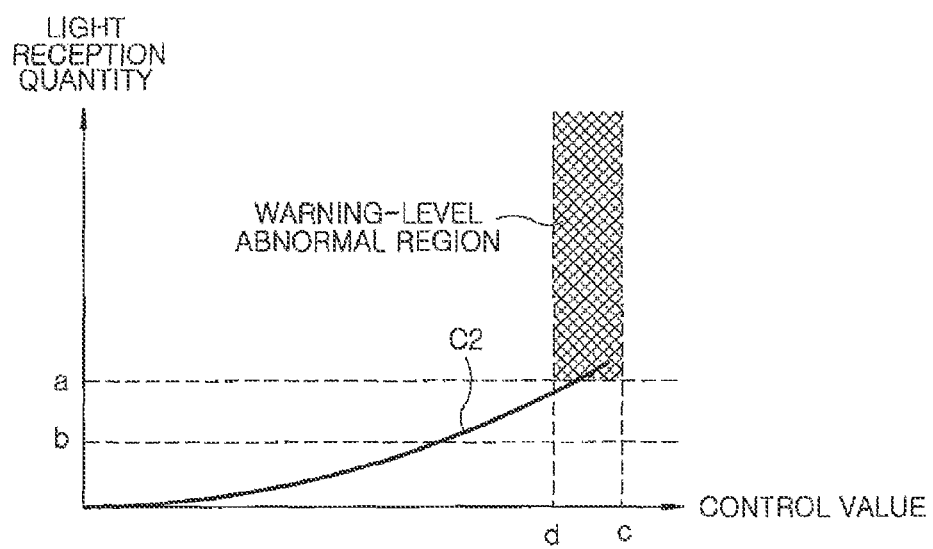
FIG. 5B is a view representing one example in which the light emitting unit is determined to be abnormal at a warning level.
Figure 5C:
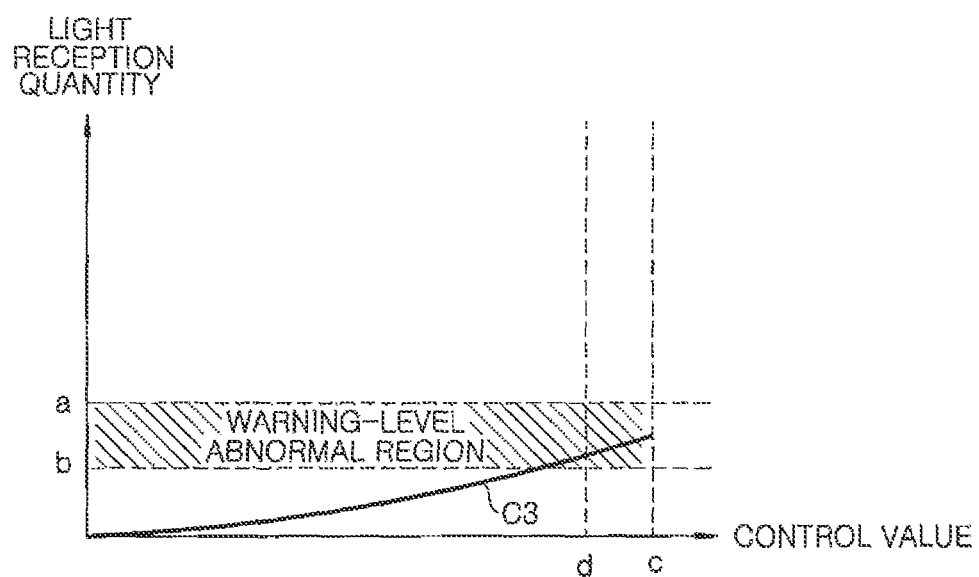
FIG. 5C is a view representing another example in which the light emitting unit is determined to be abnormal at a warning level.
Figure 5D:
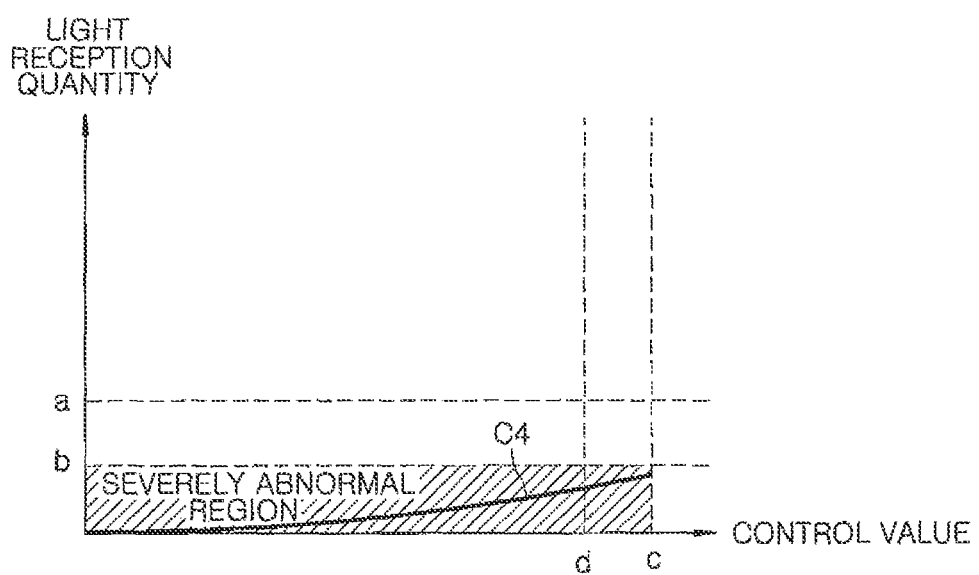
FIG. 5D is a view representing one example in which the light emitting unit is determined to be severely abnormal.

Next, the aforementioned abnormality determination performed by the adjusting unit 61b will be described in more detail with reference to FIGS. 5A to 5D. FIG. 5A is a view representing one example in which the light emitting unit 54a is determined to be normal. FIG. 5B is a view representing one example in which the light emitting unit 54a is determined to be abnormal at a warning level. FIG. 5C is a view representing another example in which the light emitting unit 54a is determined to be abnormal at a warning level. FIG. 5D is a view representing one example in which the light emitting unit 54a is determined to be severely abnormal.

If the curve described by the control value and the actual light reception quantity is a curve C1 reaching the "normal region" as shown in FIG. 5A, the adjusting unit 61b determines that the light emitting unit 54a is normal.

In this regard, it is assumed that the ideal curve described by the control value and the light reception quantity is a curve C1 as shown in FIG. 5A. In the curve C1, the control value corresponding to the lower limit warning value a is a value e. The value e corresponds to the reference value of the control value information 62b (see FIG. 4B).

As shown in FIG. 5A, the curve C1 reaches the lower limit warning value a at value f larger than the reference value e. This indicates that the curve C1 is more slowly raised than the curve C1 by the differential value (f-e).

In other words, it is presumed that the light emitting unit 54a suffers from over-time degradation although the light emitting unit 54a is not determined to be abnormal. In that case, the adjusting unit 61b adjusts the control value in such a way that the correction value is added to the control value outputted later.

More specifically, the correction value of the control value information 62b is renewed by, e.g., the aforementioned differential value (f-e). Thereafter, during the normal time, the light emission control unit 61c adds the renewed correction value to the control value at all times.

As a consequence, it is possible to maintain the wafer detection performance for a long period of time while compensating the over-time degradation of the light emitting unit 54a.

The "normal region" shown in FIG. 5A is a region where the light reception quantity corresponding to the control value changed to the upper limit warning value d or less becomes equal to or larger than the lower limit warning value a. Accordingly, the adjusting unit 61b may be called a processing unit for adjusting the control value so that the curve C1 can reach the normal region.

When the curve described by the control value and the actual light reception quantity is a curve C2 reaching the "warning-level abnormal region" as shown in FIG. 5B, the adjusting unit 61b determines that the light emitting unit 54a is abnormal at a warning level. Coping with this warning-level abnormality, the adjusting unit 61b requests the notifying unit 61d to notify a user of, e.g., a notice urging the user to replace the light emitting unit 54a at an early stage.

Although the light reception quantity exceeds the lower limit warning value a, the warning-level abnormality shown in FIG. 5B occurs because the control value exceeds the upper limit warning value d.

When the curve described by the control value and the actual light reception quantity is a curve C3 reaching the "warning-level abnormal region" as shown in FIG. 5C, the adjusting unit 61b determines that the light emitting unit 54a is abnormal at a warning level. Coping with this warning-level abnormality, the adjusting unit 61b requests the notifying unit 61d to notify a user of the same notice as mentioned by referring to FIG. 5B.

The warning-level abnormality shown in FIG. 5C occurs because the light reception quantity do not exceed the lower limit warning value even when the control value reaches the upper limit value c.

When the curve described by the control value and the actual light reception quantity is a curve C4 reaching the "severely abnormal region" as shown in FIG. 5D, the adjusting unit 61b determines that the light emitting unit 54a is severely abnormal. Coping with this severe abnormality, the adjusting unit 61b requests the notifying unit 61d to notify a user of, e.g., a notice asking the user to immediately replace the light emitting unit 54a.

The severe abnormality shown in FIG. 5D occurs because the light reception quantity do not exceed even the lower limit value b despite the fact that the control value reaches the upper limit value c.

In the examples shown in FIG. 5B to 5D, when the control value reaches the upper limit warning value d and when the light reception quantity fails to reach the lower limit warning value a, the adjusting unit 61b requests the notifying unit 61d to notify a user of a relevant notice.

In the substrate positioning device 50 in accordance with the embodiment, the adjusting unit 61b performs abnormality determination while distinguishing the timing of replacement of the light emitting unit 54a. It is therefore possible to omit the time required in diagnosing failure during maintenance and to enhance the work efficiency.

In the description made by referring to FIGS. 5A to 5D, the adjusting unit 61b adjusts the control value mainly in the "normal region". In other regions, the adjusting unit 61b does not adjust the control value but notifies the user of the abnormality. However, the present invention is not limited thereto. It is logically possible to adjust the control value so that the light reception quantity can become equal to or larger than the lower limit value b to correspond with the control value changed to the upper limit value c or less can.

Referring back to FIG. 3, description will be made on the edge acquiring unit 61e. During the normal time other than the adjusting time, the edge acquiring unit 61e performs a process of acquiring the edge position of the wafer W.

At this time, the edge acquiring unit 61e acquires and uses a predetermined threshold value corresponding to the kind of the wafer W notified from the host device 70. The predetermined threshold value is acquired from the substrate-by-substrate threshold value information 62c. Since the acquisition of the edge position has already been described with reference to FIG. 2B, no description will be made here.

The edge acquiring unit 61e delivers a rotation angle to the motor driving unit 61f to rotate the wafer W pursuant to the edge position thus acquired.

The motor driving unit 61f rotates the motor 51 at the rotation angle received from the edge acquiring unit 61e.

The storage unit 62 is a memory device such as a hard disk drive or a non-volatile memory. The storage unit 62 stores the light reception quantity information 62a, the control value information 62b and the substrate-by-substrate threshold value information 62c.

Since the light reception quantity information 62a and the control value information 62b have already been described in detail, further description thereof is omitted.

The substrate-by-substrate threshold value information 62c is the information in which predetermined threshold values used in acquiring the edge position are matched with the kinds of the wafers W. As described by referring to FIG. 2A, the threshold values corresponding to the kinds of the wafers W are decided in advance by the threshold value deciding device 80. Details on this point will be described later with reference to FIG. 7 and the following figures.

Figure 6:
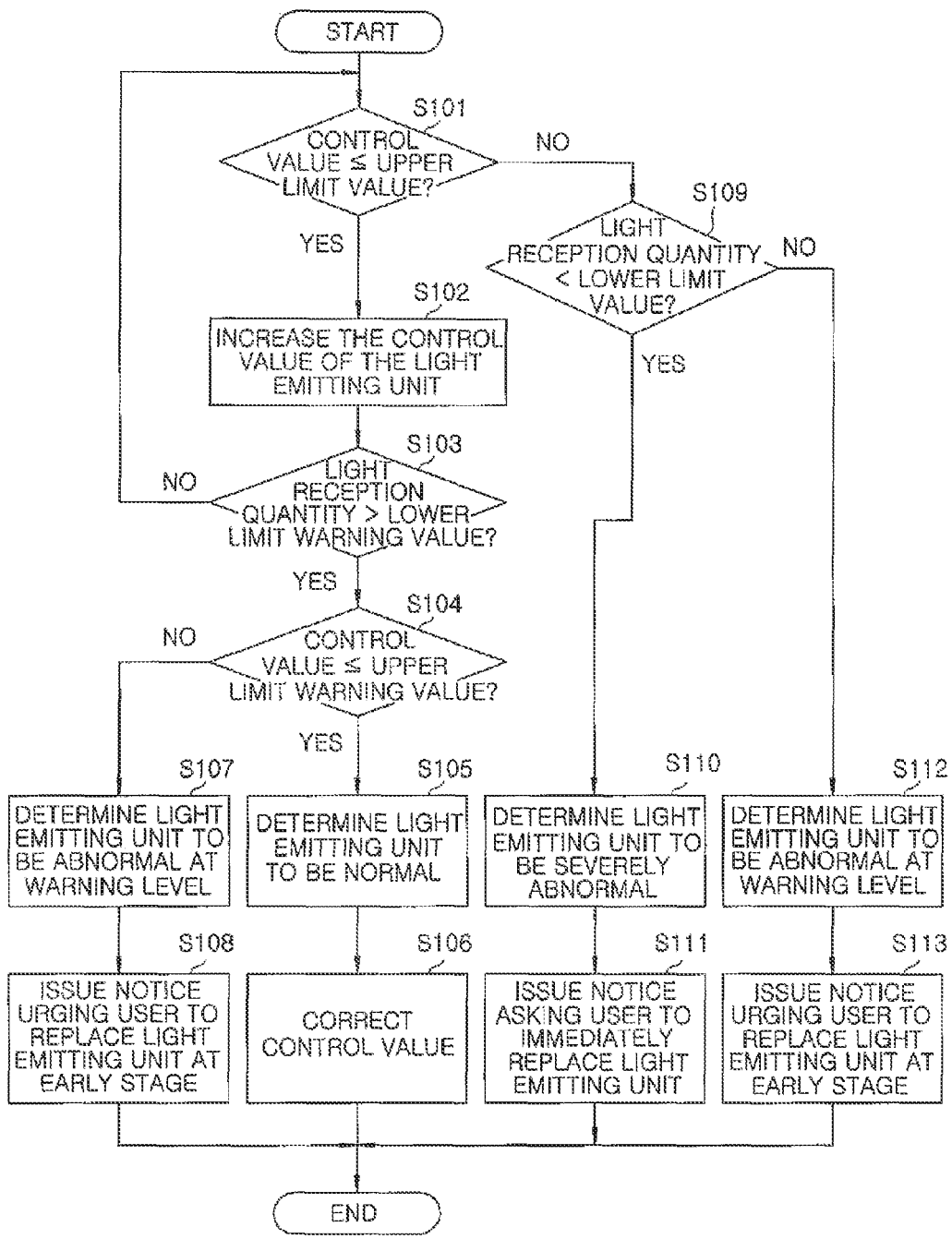
FIG. 6 is a flowchart illustrating a routine performed by a control device in accordance with the embodiment.

Next, a routine performed by the control device 60 in accordance with the embodiment will be described with reference to a flowchart shown in FIG. 6. In FIG. 6, there is illustrated the routine executed just after the start of an adjusting process mainly performed by the adjusting unit 61b of the control device 60.

As shown in FIG. 6, the adjusting unit 61b first determines whether or not the control value (present value) for controlling the light emitting unit 54a is equal to or smaller than the upper limit value of the control value information 62b in step S101. If the control value is equal to or smaller than the upper limit value (if yes in step S101), the adjusting unit 61b increases the control value and turns on the light emitting unit 54a in step S102.

The adjusting unit 61b receives a light reception quantity with respect to the light emission quantity of the light emitting unit 54a from the light reception quantity detecting unit 61a and determines whether or not the light reception quantity is larger than the lower limit warning value of the light reception quantity information 62a in step S103. When the light reception quantity is greater than the lower limit warning value (if yes in step S103), the adjusting unit 61b proceeds to step S104. If the determination condition of step S103 is not satisfied (if no in step S103), the adjusting unit 61b repeats the processing of from steps S101 to S103.

Subsequently, the adjusting unit 61b determines whether or not the control value is equal to or smaller than the upper limit warning value of the control value information 62b in step S104. If the control value is equal to or smaller than the upper limit warning value (if yes in step S104), the adjusting unit 61b determines that the light emitting unit 54a is normal in step S105. If necessary, the control value is corrected (namely, the correction value is calculated and registered) in step S106. Thereafter, the processing is completed.

If the determination condition of step S104 is not satisfied (if no in step S104), the adjusting unit 61b determines that the light emitting unit 54a is abnormal at a warning level in step S107. The adjusting unit 61b notifies a user of a notice urging the user to replace the light emitting unit 54a at an early state in step S108. Thereafter, the processing is completed.

In the meantime, if the determination condition of step S101 is not satisfied (if no in step S101), the adjusting unit 61b determines whether or not the light reception quantity is smaller than the lower limit value of the light reception quantity information 62a in step S109. If the light reception quantity is smaller than the lower limit value (if yes in step S109), the adjusting unit 61b determines that the light emitting unit 54a is severely abnormal in step S110. The adjusting unit 61b notifies a user of a notice asking the user to immediately replace the light emitting unit 54a in step S111. Thereafter, the processing is completed.

If the determination condition of step S109 is not satisfied (if no in step S109), the adjusting unit 61b determines that the light emitting unit 54a is abnormal at a warning level in step S112. The adjusting unit 61b notifies a user of a notice urging the user to replace the light emitting unit 54a at an early state in step S113. Thereafter, the processing is completed.

As described above, for the normal time at which the positioning of the wafer W is performed, the substrate positioning device 50 performs acquisition of the edge position of the wafer W by using the specified threshold values matched with the kinds of the wafers W.

The reason for differently setting the threshold values depending on the kinds of the wafers W is that the wafers W have different characteristics in terms of, e.g., the material such as silicon or glass and the shape of edge end surfaces. In order to appropriately acquire the edge position by making up for the light transmittance and the light reflectance depending on the difference in characteristics, the threshold value deciding process performed by the threshold value deciding device 80 is of importance.

Thus, the threshold value deciding process performed by the threshold value deciding device 80 in accordance with the embodiment will now be described with reference to FIGS. 7 to 9.

Figure 7:
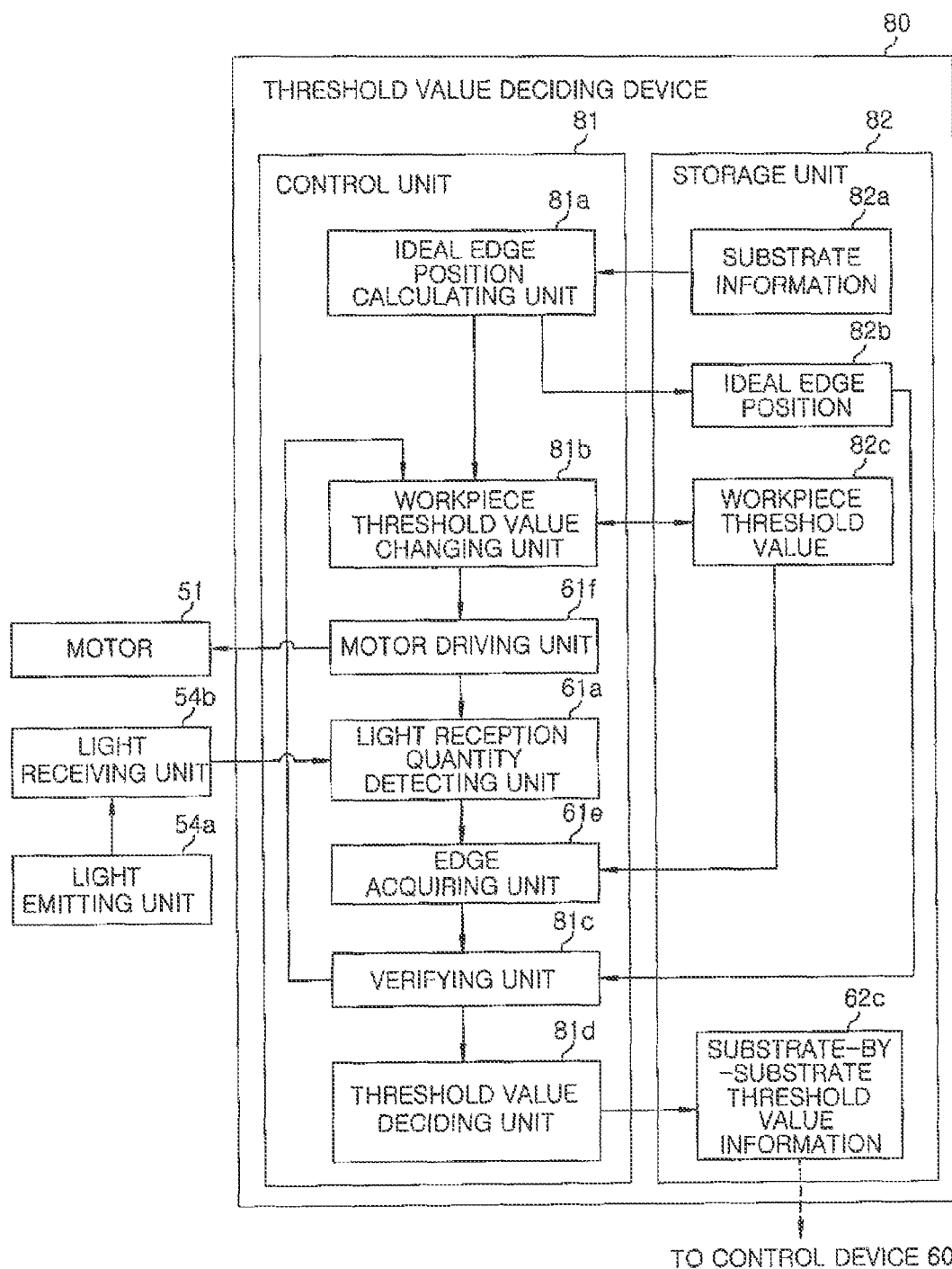
FIG. 7 is a block diagram one configuration example of a threshold value deciding device in accordance with the embodiment.

FIG. 7 is a block diagram showing one configuration example of the threshold value deciding device 80 in accordance with the embodiment. In FIG. 7, there are shown only the components required in describing a threshold value deciding method performed by the threshold value deciding device 80. Other typical components are not shown in FIG. 7.

Just like the control device 60, when connected to the unshipped substrate positioning device 50, the threshold value deciding device 80 can control the respective components such as the motor 51, the light emitting unit 54a and the light receiving unit 54b.

Therefore, in FIG. 7, the same components as those of the control device 60 shown in FIG. 3 are designated by like reference symbols with no or brief description made thereon. In the following description, the ideal edge position of the wafer W to be processed will be referred to as "ideal edge position".

The following description is directed to a case where the threshold values are decided in advance by the threshold value deciding device 80 connected to the unshipped substrate positioning device 50. Alternatively, a processing unit for performing a threshold value deciding sequence to be described below may be built in the control device 60 so that the threshold values can be dynamically adjusted through the use of the processing unit during the actual operation after shipment.

As shown in FIG. 7, the threshold value deciding device 80 includes a control unit 81 and a storage unit 82. The control unit 81 includes an ideal edge position calculating unit 81a, a workpiece threshold value changing unit 81b, a motor driving unit 61*f*, a light reception quantity detecting unit 61*a*, an edge acquiring unit 61*e*, a verifying unit 81*c* and a threshold value deciding unit 81*d*. The storage unit 82 stores substrate information 82*a*, ideal edge position 82*b*, workpiece threshold values 82*c* and the substrate-by-substrate threshold value information 62*c*.

The workpiece threshold values 82*c* stored in the storage unit 82 may include, e.g., a plurality of values increasing step by step from the minimum value to the maximum value. Alternatively, only the minimum value and the maximum value may be stored in the storage unit 82 and the minimum value may be increased step by step to the maximum value to be used during the threshold value deciding process.

In this regard, it is assumed that the wafer W to be subjected to the threshold value deciding process is placed on the mounting table 53 (see FIG. 2A) by a worker or the robot 10 (see FIG. 1) with no eccentricity.

The ideal edge position calculating unit 81*a* calculates the ideal edge position on the basis of the substrate information 82*a* that defines the information on the wafers W depending on the kinds of the wafers W. The calculation result is registered in the storage unit 82 as the ideal edge position 82*b*.

For the sake of easier understanding of the threshold value deciding process, the outline of the threshold value deciding process will be described with reference to FIG. 8A.

Figures 8A, 8B, 8C:
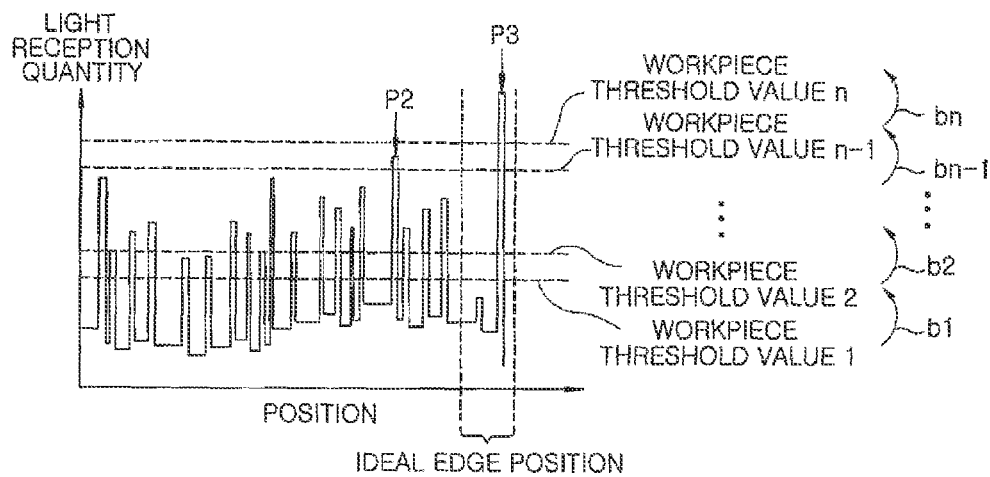
FIG. 8A is a view showing an outline of a threshold value deciding process.
FIG. 8B is a view illustrating one example of the substrate information.
FIG. 8C is a view illustrating one example of the substrate-by-substrate threshold value information.

As shown in FIG. 8A, during the threshold value deciding process, the workpiece threshold value is increased step by step and is matched with the light reception quantity detected by the line sensor 54*bb* (see FIG. 2B) to verify whether or not the edge positions acquired depending on the workpiece threshold values fall within the permissible range of the ideal edge position 82*b*, thereby deciding the threshold value that binarizes the light reception quantity of the line sensor 54*bb*.

In other words, as shown in FIG. 8A, the workpiece threshold values 1 to n are matched in the order indicated by arrows b1 to bn. For example, the position P2 exceeding the workpiece threshold value n−1 is acquired as the edge position. Since the position P2 does not fall within the permissible range of the ideal edge position 82*b*, the workpiece threshold value n−1 is increased to the workpiece threshold value n.

Since the position P3 acquired at the next workpiece threshold value n falls within the permissible range of the ideal edge position 82*b*, the threshold value deciding device 80 decides the workpiece threshold value n as the threshold value that binarizes the light reception quantity of the line sensor 54*bb*.

Accordingly, even if different kinds of wafers W exist, it is possible to decide suitable threshold values corresponding to the kinds of the wafers W. This makes it possible to accurately perform the task of acquiring the edge of the wafer W and the task of positioning the wafer W.

The foregoing description is directed to a case where the threshold value is decided while increasing the workpiece threshold value. In that case, the searching direction of the light quantity becoming the threshold value is from the dark side toward the bright side.

If the searching direction is opposite to the above, i.e., from the bright side toward the dark side, it is desirable that the workpiece threshold value be decreased step by step from the possible maximum value to the minimum value. In the following description, the case where the workpiece threshold value is increased as the above will be taken as an example.

In the event that the substrate positioning device 50 dynamically adjusts the threshold value during the actual operation after shipment, it is desirable to use the original threshold value registered thus far as the workpiece threshold value and to verify whether the edge position acquired pursuant to the workpiece threshold value falls within the permissible range of the ideal edge position 82*b*.

If the acquired edge position does not fall within the permissible range, it is desirable to acquire the edge position while changing the workpiece threshold value in the aforementioned manner and to adjust the threshold value until the acquired edge position becomes a suitable value falling within the permissible range of the ideal edge position 82*b*. At this time, the workpiece threshold value may not be changed from the possible minimum value to the maximum value but may be changed by a specified width on the basis of the original threshold value registered in advance.

Referring back to FIG. 7, description will be made on the ideal edge position calculating unit 81*a*. The ideal edge position calculating unit 81*a* notifies the workpiece threshold value changing unit 81*b* of the start of the threshold value deciding process.

Responsive to the start of the threshold value deciding process, the workpiece threshold value changing unit 81*b* takes out the workpiece threshold value 82*c* as the threshold value for the workpiece and increases the workpiece threshold value 82*c* step by step from the possible minimum value to the maximum value. The workpiece threshold value changing unit 81*b* renews the workpiece threshold value 82*c* each time of the increasing. That is to say, the present value of the threshold value for the workpiece is always registered in the workpiece threshold value 82*c*.

Each time the workpiece threshold value 82*c* is increased, the workpiece threshold value changing unit 81*b* requests the motor driving unit 61*f* to rotate the wafer W by one revolution. In response to this request, the motor driving unit 61*f* drives the motor 51 to rotate the wafer W by one revolution.

As the motor 51 is driven by the motor driving unit 61*f*, the light reception quantity detecting unit 61*a* detects the light reception quantity corresponding to one revolution of the wafer W.

The edge acquiring unit 61*e* acquires the edge position of the wafer W based on the light reception quantity detected by the light reception quantity detecting unit 61*a* and the workpiece threshold value 82*c*. The edge acquiring unit 61*e* delivers the acquired edge position and the present value of the workpiece threshold value 82*c* to the verifying unit 81*c*.

The verifying unit 81*c* verifies the acquired edge position based on the ideal edge position 82*b* and present value of the workpiece threshold value 82*c* received. If the verification result reveals that the acquired edge position is proper, the verifying unit 81*c* delivers the present value of the workpiece threshold value 82*c* to the threshold value deciding unit 81*d*.

If the verification result reveals that the acquired edge position is not proper, the verifying unit 81*c* requests the workpiece threshold value changing unit 81*b* to increase the workpiece threshold value 82*c*.

The threshold value deciding unit 81*d* decides the received present value of the workpiece threshold value 82*c* as the threshold value and registers the decided threshold value in the substrate-by-substrate threshold value information 62*c* in a corresponding relationship with the kind of the wafer W to be processed.

As indicated by a broken line arrow in FIG. 7, the substrate-by-substrate threshold value information 62*c* is stored in the control device 60 at the time of shipment of the substrate positioning device 50. In case where the threshold value is dynamically adjusted during the actual operation after shipment, the substrate-by-substrate threshold value information 62*c* is renewed by the decided threshold value.

The storage unit 82 is a memory device like the storage unit 62 shown in FIG. 3. The substrate information 82a shown in FIG. 7 is the information on the wafers W corresponding to the kinds of the wafers W. One example of the substrate information 82a will now be described with reference to FIG. 8B.

As shown in FIG. 8B, it is assumed that the kinds of the wafers W include "substrate A" and "substrate B". The substrate information 82a can be defined by, e.g., the "diameter" of the wafers W, with respect to the kinds of the wafers W. For the sake of convenience, the "diameter" of the "substrate A" is defined as "g" and the "diameter" of the "substrate B" is defined as "h".

The ideal edge position calculating unit 81a is configured to calculate the ideal edge position of the wafer W based on the "diameter" and so forth.

As shown in FIG. 8B, the substrate information 82a may include the "permissible width" of the ideal edge position, which is defined as "±i" in case of the "substrate A" and as "±j" in case of the "substrate B" for the sake of convenience. If the "permissible width" is defined in this manner, the ideal edge position calculating unit 81a applies the "permissible width" to the calculated value, i.e., the edge position obtained based on, e.g., the diameter, to register the result as the ideal edge position 82b.

One example of the substrate-by-substrate threshold value information 62c will now be described with reference to FIG. 8C.

As shown in FIG. 8C, the substrate-by-substrate threshold value information 62c is the information in which the "threshold values" and so forth are matched with the kinds of the wafers W. In FIG. 8C, for the sake of convenience, the "threshold value" of the "substrate A" is defined as "k" and the "threshold value" of the "substrate B" is defined as "l".

It is presumable that the substrate positioning device operating after the shipment is requested by the host device 70 to process a new kind of wafer W not existing in the substrate-by-substrate threshold value information 62c.

In that case, the substrate positioning device 50 may perform the aforementioned threshold value deciding sequence to decide the threshold value with respect to the new kind of wafer W in response to the request to process the new kind of wafer W.

Next, a routine performed by the threshold value deciding device 80 in accordance with the embodiment will be described with reference to a flowchart shown in FIG. 9. In FIG. 9, there is illustrated a routine for processing a single wafer W of one kind.

Figure 9:
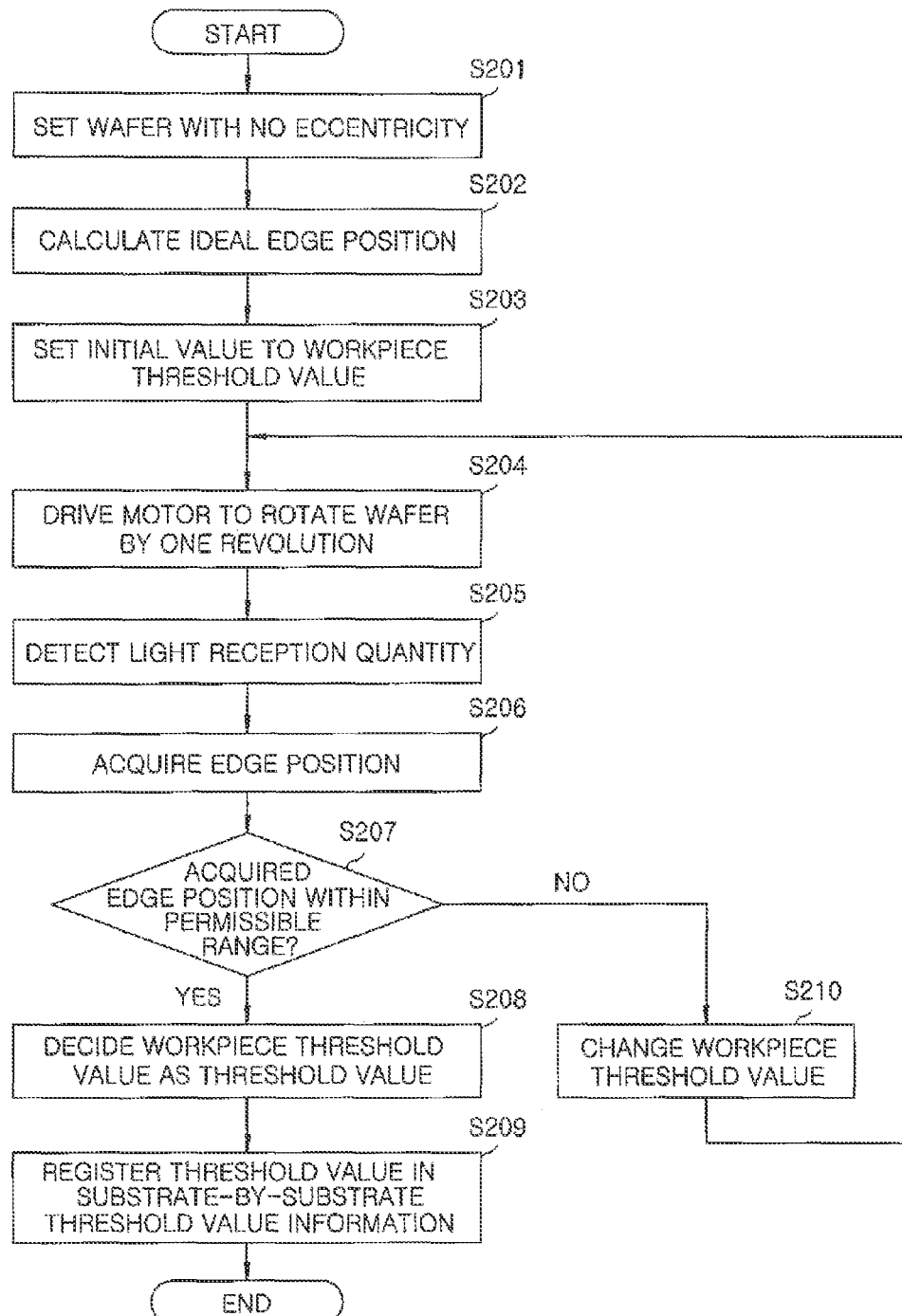
FIG. 9 is a flowchart illustrating a routine performed by the threshold value deciding device in accordance with the embodiment.

Referring to FIG. 9, the wafer W to be subjected to the threshold value deciding process is first mounted on the mounting table 53 with no eccentricity in step S201. Step S201 is preferably carried out by a worker.

The ideal edge position calculating unit 81a calculates and finds the ideal edge position 82b in step S202. The workpiece threshold value changing unit 81b sets an initial value to the workpiece threshold value 82c in step S203.

The motor driving unit 61f drives the motor 51 to rotate the wafer W by one revolution in step S204. The light reception quantity detecting unit 61a detects the light reception quantity at the time when the wafer W is rotated in this manner in step S205.

The edge acquiring unit 61e acquires the edge position of the wafer W based on the light reception quantity and the workpiece threshold value 82c in step S206. The verifying unit 81c determines whether or not the acquired edge position falls within the permissible range of the ideal edge position 82b in step S207.

If the acquired edge position falls within the permissible range of the ideal edge position 82b (if yes in step S207), the threshold value deciding unit 81d decides the workpiece threshold value 82c as the threshold value in step S208 and registers the decided threshold value in the substrate-by-substrate threshold value information 62c in step S209. Thereafter, the processing is completed.

On the other hand, if the determination condition of step S207 is not satisfied (if no in step S207), the workpiece threshold value changing unit 81b changes the workpiece threshold value 82c in step S210, after which the processing from step S204 to step S207 is repeated.

As set forth above, the substrate positioning device in accordance with the embodiment includes the supporting unit, the light emitting unit, the light receiving unit, a light emission control unit, the detecting unit and the adjusting unit. The supporting unit supports a substrate in place. The light emitting unit and the light receiving unit are arranged at the major surface sides of the substrate to face each other. The light emission control unit controls the light emission quantity of the light emitting unit depending on the control value. The detecting unit detects the light reception quantity received by the light receiving unit. The adjusting unit adjusts the control value pursuant to the light reception quantity while the substrate is not supported by the supporting unit.

With the substrate positioning device in accordance with the embodiment, it is therefore possible to maintain the substrate detection performance for a long period of time.

In the embodiment described above, the adjusting process is performed when the detected light reception quantity is smaller than the lower limit warning value and when the wafer is not supported in place. However, the present invention is not limited thereto.

For example, an input command such as a calibration command may be provided. The adjusting process may be started at the time when the input command is received from a worker.

In that case, the worker can visually confirm that the wafer is not supported in place and the adjusting process can be performed by a simple operation such as a command input operation. This assists in enhancing the maintainability.

In the embodiment described above, the case where the substrate is a wafer has been described by way of example. Other kinds of substrate may be applied in the embodiment.

In the embodiment described above, the case where the light receiving unit is a photodiode or a line sensor has been described by way of example. However, the present invention is not limited thereto. For example, the light receiving unit may be a fiber sensor or other light receiving element.

In the embodiment described above, the substrate positioning device provided in a substrate transferring processing system has been described by way of example. However, the kind of system provided with the substrate positioning device is not limited thereto.

Other effects and other modified examples can be readily derived by those skilled in the art. For that reason, the broad aspect of the present disclosure is not limited to the specific disclosure and the representative embodiment shown and described above. Accordingly, the present disclosure can be modified in many different forms without departing from the scope defined by the appended claims and the equivalents thereof.

What is claimed is:
1. A substrate positioning device, comprising:
a supporting unit for supporting a substrate in place;

a light emitting unit and a light receiving unit respectively arranged at major surface sides of the substrate to face each other;

a light emission control unit configured to control a light emission quantity of the light emitting unit pursuant to a control value;

a detecting unit for detecting a light reception quantity received by the light receiving unit; and an adjusting unit for controlling the control value pursuant to the light reception quantity while the substrate is not supported by the supporting unit.

2. The device of claim 1, further comprising:

a storage unit for storing control value information including an upper limit value of the control value which is allowed to be outputted by the light emission control unit and light reception quantity information including a lower limit value of the light reception quantity which is allowed to be detected by the detecting unit, wherein the adjusting unit is configured to control the control value such that the light reception quantity corresponding to the control value changed to the upper limit value or less becomes equal to or larger than the lower limit value.

3. The device of claim 2, wherein the control value information further includes a first threshold value smaller than the upper limit value, the light reception quantity information further includes a second threshold value larger than the lower limit value, and the adjusting unit is configured to control the control value such that the light reception quantity corresponding to the control value changed to the first threshold value or less becomes equal to or larger than the second threshold value.

4. The device of claim 3, further comprising:

a notifying unit for notifying a user of an abnormality of the light emitting unit, wherein the adjusting unit is configured to request the notifying unit to notify the user of the abnormality if the light reception quantity fails to exceed the second threshold value even when the control value is increased to the first threshold value.

5. The device of claim 4, wherein the adjusting unit is configured to request the notifying unit to notify the user of the abnormality if the light reception quantity fails to exceed the second threshold value even when the control value is increased to the upper limit value.

6. The device of claim 4, wherein the adjusting unit is configured to request the notifying unit to notify the user of the abnormality if the light reception quantity fails to exceed the lower limit value even when the control value is increased to the upper limit value.

7. The device of claim 5, wherein the adjusting unit is configured to request the notifying unit to notify the user of the abnormality if the light reception quantity fails to exceed the lower limit value even when the control value is increased to the upper limit value.

8. The device of claim 2, further comprising:

a notifying unit for notifying a user of an abnormality of the light emitting unit, wherein the adjusting unit is configured to request the notifying unit to notify the user of the abnormality if the light reception quantity fails to exceed the lower limit value even when the control value is increased to the upper limit value.

9. A substrate positioning device, comprising:

a supporting unit configured to support a substrate in place;

a light emitting unit and a light receiving unit respectively arranged at major surface sides of the supported substrate to face each other;

a light emission control unit configured to control a light emission quantity of the light emitting unit pursuant to a control value;

a detecting unit configured to detect a light reception quantity received by the light receiving unit while no substrate is supported by the supporting unit; and an adjusting unit configured to adjust the control value pursuant to the light reception quantity.

10. The substrate positioning device of claim 9, wherein the adjusting unit is configured to adjust the control value while no substrate is supported by the supporting unit.

11. The device of claim 9, further comprising:

a storage unit for storing control value information including an upper limit value of the control value which is allowed to be outputted by the light emission control unit and light reception quantity information including a lower limit value of the light reception quantity which is allowed to be detected by the detecting unit, wherein the adjusting unit is configured to control the control value such that the light reception quantity corresponding to the control value changed to the upper limit value or less becomes equal to or larger than the lower limit value.

12. The device of claim 11, wherein the control value information further includes a first threshold value smaller than the upper limit value, the light reception quantity information further includes a second threshold value larger than the lower limit value, and the adjusting unit is configured to control the control value such that the light reception quantity corresponding to the control value changed to the first threshold value or less becomes equal to or larger than the second threshold value.

13. The device of claim 12, further comprising:

a notifying unit for notifying a user of an abnormality of the light emitting unit, wherein the adjusting unit is configured to request the notifying unit to notify the user of the abnormality if the light reception quantity fails to exceed the second threshold value even when the control value is increased to the first threshold value.

14. The device of claim 13, wherein the adjusting unit is configured to request the notifying unit to notify the user of the abnormality if the light reception quantity fails to exceed the second threshold value even when the control value is increased to the upper limit value.

15. The device of claim 13, wherein the adjusting unit is configured to request the notifying unit to notify the user of the abnormality if the light reception quantity fails to exceed the lower limit value even when the control value is increased to the upper limit value.

16. The device of claim 14, wherein the adjusting unit is configured to request the notifying unit to notify the user of the abnormality if the light reception quantity fails to exceed the lower limit value even when the control value is increased to the upper limit value.

17. The device of claim 11, further comprising:

a notifying unit for notifying a user of an abnormality of the light emitting unit, wherein the adjusting unit is configured to request the notifying unit to notify the user of the abnormality if the light reception quantity fails to exceed the lower limit value even when the control value is increased to the upper limit value.

* * * * *